United States Patent
Hsu et al.

(10) Patent No.: US 6,291,306 B1
(45) Date of Patent: Sep. 18, 2001

(54) METHOD OF IMPROVING THE VOLTAGE COEFFICIENT OF RESISTANCE OF HIGH POLYSILICON RESISTORS

(75) Inventors: Yung-Lung Hsu; Shun-Liang Hsu, both of Hsin-Chu; Yean-Kuen Fang, Tainan; Mao-Hsiung Kuo, Kao-hsiung, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/357,243

(22) Filed: Jul. 19, 1999

(51) Int. Cl.[7] .................................................. H01L 21/20
(52) U.S. Cl. ........................ 438/385; 438/381; 438/382; 438/383; 438/384; 438/466; 438/470
(58) Field of Search ..................... 438/381, 382, 438/383, 384, 385, 466, 470

(56) References Cited

U.S. PATENT DOCUMENTS

| | | | |
|---|---|---|---|
| 4,263,518 | 4/1981 | Ballatore et al. ..................... | 307/303 |
| 4,560,422 | * 12/1985 | Patel ....................................... | 148/33 |
| 5,391,979 | 2/1995 | Kajimoto et al. ..................... | 323/313 |
| 5,466,484 | * 11/1995 | Spraggins et al. ................... | 437/228 |
| 5,489,547 | 2/1996 | Erdeljac et al. ....................... | 437/60 |
| 5,554,873 | 9/1996 | Erdeljac et al. ...................... | 257/380 |
| 5,640,137 | 6/1997 | Mantha ................................. | 338/308 |
| 5,679,275 | * 10/1997 | Spraggins et al. ................... | 219/505 |
| 6,163,013 | * 12/2000 | King et al. ............................ | 219/203 |

* cited by examiner

Primary Examiner—Richard Booth
Assistant Examiner—Jennifer M. Kennedy
(74) Attorney, Agent, or Firm—George O. Saile; Stephen B. Ackermana; William J. Sotffel

(57) ABSTRACT

A method of forming a high polysilicon resistor over a dielectric layer, comprising the following steps. A polysilicon resistor over a semiconductor structure is provided. The polysilicon resistor has a doped polysilicon layer having a first voltage coefficient of resistance and grain boundaries having a first trapping density. A to a first level of DC current is provided for a predetermined duration through the doped polysilicon layer to stress the doped polysilicon layer to partially melt the doped polysilicon layer without causing breakdown of the doped polysilicon layer. The to a first level of DC current is removed to allow recrystallization of the melted doped polysilicon layer, whereby the recrystallized doped polysilicon layer has a second voltage coefficient of resistance less than the first voltage coefficient of resistance and grain boundaries having a second trapping density that is less than the first trapping density. This makes the Rs of the polysilicon to be stable and saturated.

15 Claims, 6 Drawing Sheets

METHOD OF IMPROVING THE VOLTAGE COEFFICIENT OF RESISTANCE OF HIGH POLYSILICON RESISTORS

FIELD OF THE INVENTION

The present invention relates to the field of resistors integral with a semiconductor body and specifically to a method of reducing the voltage coefficient of resistance (VCR) of high polysilicon resistors used in semiconductor devices, and a method of forming such high polysilicon resistors.

BACKGROUND OF THE INVENTION

A resistor is a two contact, no-junction monoelement device that serves to limit current flow. The resistance of a resistor is determined by the sheet resistance of the resistive region and the number of squares (□'s) contained in the resistive region. The number of squares is found by dividing the length by the width. Therefore a 1 μm×10 μm resistor has 10□'s while a 50 μm×50 μm resistor has 1□. A polysilicon resistor is a strip of polysilicon doped with a material, such as N-type phosphorous ($P_{31}$) or arsenic ($As_{75}$), or P-type boron ($B_{11}$), to be made more conductive. A normal polysilicon resistor has a sheet resistance, $R_s$, less than 30 Ω/□(ohms/square) while a high polysilicon resistor has a sheet resistance, $R_s$, greater than 100 Ω/□(ohms/square) (and generally less than 2k Ω/□(ohms/square)).

Due to the physical characteristics of polysilicon, there are many defects in the grain boundaries that make the polysilicon resistance change widely as the supply voltage changes as measured by the resistor's voltage coefficient of resistance (VCR), limiting the applications for polysilicon resistors. A resistor's VCR may be improved by adding to the resistor's dimensions, but this would increase the area of circuit design which is undesirable with the continued push towards increasing micominiaturization if semiconductor devices. Other attempts to overcome and avoid these defects have included using laser beams or similar high energy beams to anneal the deposited polysilicon.

For example, U.S. Pat. No. 4,560,422 to Patel discloses a polysilicon resistor with a reduced VCR by modifying the polysilicon to a polysilicon of lowered resistance by laser beam annealing. A metal reflective layer is deposited and etched to protect other areas, e.g. dielectrically isolated islands, from the laser beam annealing thus allowing formation of the desired resistor only in areas where formation is necessary.

U.S. Pat. No. 4,263,518 to Ballatore et al. discloses a method and apparatus for correcting the VCR of a resistor integral with a semiconductor body by using a metal conducting electrode layer formed on the dielectric and at least partially covering the resistive region of the resistor. The metal layer is brought to a suitable potential to produce equal and opposite variations in the resistance with respect to the ones created by the epitaxial layer, thus acting to ensure the resistance's linearity.

U.S. Pat. Nos. 5,489,547 and 5,554,873 to Erdeljac et al. each disclose a semiconductor device, and a method of forming same, having a p type polysilicon resistor with a moderate sheet resistance and low temperature coefficient of resistance formed by a double-level polysilicon process. A polysilicon resistor being of a first conductivity type and having a first temperature coefficient of resistance is formed over, and insulated from, a semiconductor layer. The polysilicon resistor is then doped with a dopant of a second conductivity type opposite the first conductivity type causing the polysilicon resistor to be of the second conductivity type and to have a second temperature coefficient of resistance that is closer to zero than the first temperature coefficient of resistance.

U.S. Pat. No. 5,640,137 to Mantha discloses a polysilicon resistor having additional structures that add to the polysilicon resistor's area and therefore reduce the self-induced temperature change caused by the voltage across the polysilicon resistor. Since the resistance depends upon the polysilicon resistor's temperature, the reduction of the self-induced temperature change lowers the variation in the resistance value at different voltages.

U.S. Pat. No. 5,391,979 to Kajimoto et al. discloses a constant current generating circuit including a high resistance element, normally turned on, for generating a very small current. Since the very small current is supplied from the high resistance element a constant current can be stably generated regardless of the change of the power supply voltage.

SUMMARY OF THE INVENTION

Accordingly, it is an object of the present invention to provide a method of reducing the voltage coefficient of resistance (VCR) of high polysilicon resistors used in semiconductor devices.

Another object of the present invention is to provide a method of reducing the voltage coefficient of resistance (VCR) of high polysilicon resistors used in semiconductor devices by DC current stressing the resistor.

Other objects will appear hereinafter.

It has now been discovered that the above and other objects of the present invention may be accomplished in the following manner. Specifically, a high polysilicon resistor is formed over a dielectric layer by the following steps. A semiconductor structure having an overlying field oxide layer thereon is provided. A polysilicon layer is formed over a portion of the field oxide layer with the polysilicon layer comprising grains and having grain boundaries. A dopant is ion implanting to a first concentration within the polysilicon layer to form a resistor. An interlevel dielectric layer is then formed over the doped polysilicon layer. Defined contact openings are formed in the interlevel dielectric layer over the doped polysilicon layer. Metal contacts are then formed in the contact openings contacting the doped polysilicon layer. A first level of DC current, for a first duration, is then applied to the resistor to stress the resistor, whereby the polysilicon layer partially melts and then recrystallizes decreasing the trapping density of the polysilicon grain boundaries and reducing the voltage coefficient of resistance (VCR) of the resistor. The resistor may be DC current stressed at the wafer acceptance testing stage or the wafer sort stage providing an efficient method of reducing the VCR.

BRIEF DESCRIPTION OF THE DRAWINGS

The features and advantages of the method of improving the voltage coefficient of resistance of high polysilicon resistors according to the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, processes etc. may be formed or accomplished by conventional methods known in the prior art.

Accordingly as shown in FIGS. 1–4, high polysilicon resistor 14a may be formed on field oxide layer 12 over semiconductor structure 10 by any conventional method. Semiconductor structure 10 is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

Figure 1:
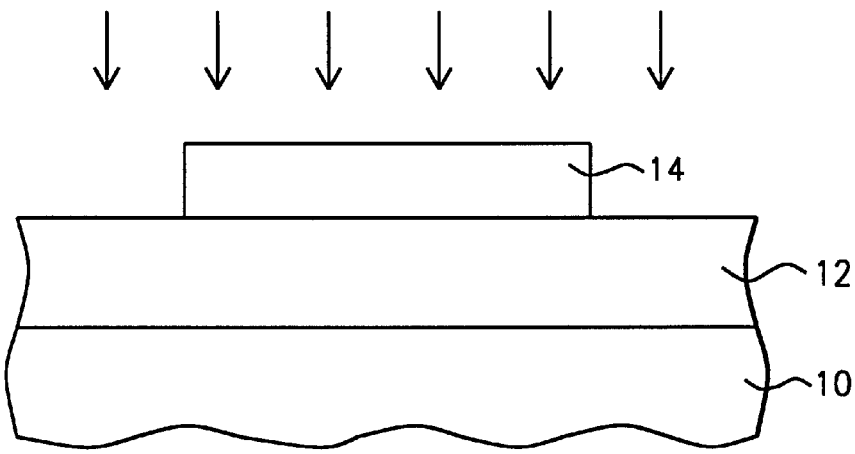
FIGS. 1 to 4 show a series of schematic cross-sectional diagrams illustrating the results of progressive stages in forming a high polysilicon resistor in a semiconductor device in accordance with a preferred embodiment of the method of the present invention, with FIG. 4 an overhead view of the structure of FIG. 3.

As shown in FIG. 1, field oxide layer (FOX) 12 is formed over semiconductor structure 10 with polysilicon layer 14 formed over a portion of field oxide layer 12. Polysilicon layer 14 is preferably from about 2000 to 4500 Å thick and is deposited from about 550 to 650 ° C.

Polysilicon layer 14 is then selectively doped by, preferably, ion implantation with, preferably, phosphorus ($P_{31}$), at an energy of from about 30 to 50 keV and at a dose of from about 1.0E15 to 2.1E15 atoms/cm² and more preferably at an energy of 30 keV and at a dose of 1.3E15 atoms/cm² to form a high polysilicon resistor 14a. Polysilicon layer 14 may also be selectively doped with arsenic ($As_{75}$) or boron ($B_{11}$).

Figure 2:
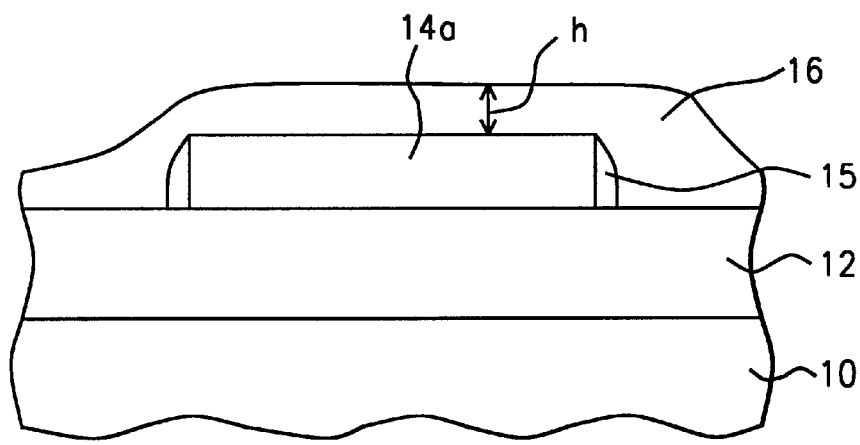
Figure 3:
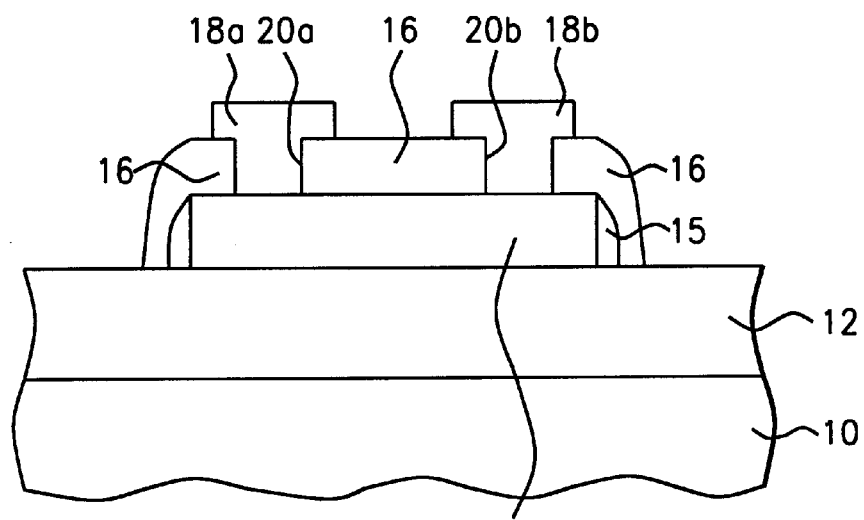
Figure 4:
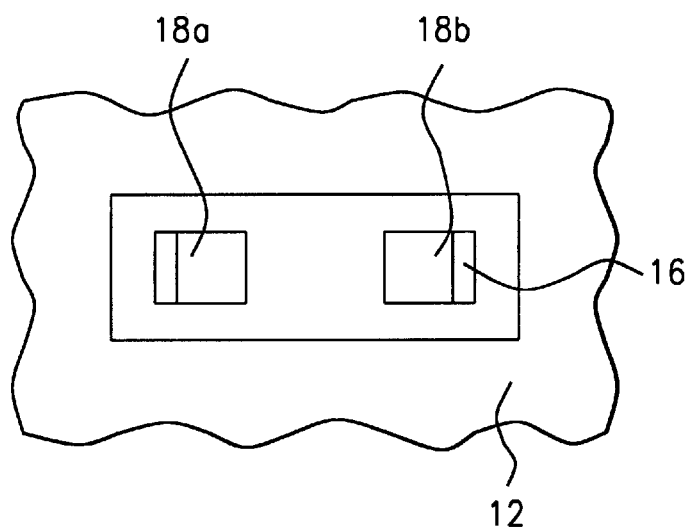

As shown in FIG. 2, spacers 15 are formed adjacent polysilicon layer 14 preferably by depositing and patterning a TEOS (tetraethylorthosilicate) layer. An interlevel dielectric layer (ILD) 16, preferably boron phosphorus silicon glass (BPSG), is formed over doped polysilicon layer 14 and spacers 15 to a thickness, h, from about 4500 to 9000 Å and preferably 7500 Å. BPSG layer 16 is then removed from FOX layer 12, then masked and etched to form contact channels 20a and 20b as shown in FIG. 3. Metal contacts 18a, 18b are then deposited into contact channels 20a, 20b, respectively, preferably by sputtering. See FIGS. 3 and 4. Metal contacts 18a, 18b may be comprised of AlSi, and are preferably comprised of Ti+TiW+AlSiCu.

After the wafer fabrication is finished, high polysilicon resistor 14a is connected to a power source via metal contacts 18a, 18b and a DC stress current is passed through it for a duration from about 0.1 to 10 seconds, more preferably 0.9 to 1.1, and most preferably 1.0 second and at a level greater than the DC current that makes the polysilicon grain boundaries within doped polysilicon layer 14a melt, but less than what would cause the doped polysilicon layer 14a to breakdown. Doped polysilicon layer 14a is then allow to recrystallize. This causes the dopant, for example P31, to be trapped in the polysilicon grain boundaries.

Tests were conducted with patterned high polysilicon resistors 14a with the following dimensions:
width: 1.0 μm, 3.0 μm, 5.5 μm and 10.0 μm
length: 10 μm, 20 μm, 50 μm, 100 μm and 650 μm
with ion-implantation doses of:
15E4, 7E14, 1E15, 1.3E15 and 3.8E15 with $P_{31}$, 50 keV with 1.3E15 with P31 @ 50 keV most preferred.

DC current was swept through these patterned high polysilicon resistors 14a so formed from 0 mA (no stress) until polysilicon breakdown to determine their respective sheet resistance, $R_s$.

The voltage coefficient of resistance (VCR) is defined:

$$VCR \equiv \frac{\frac{\partial R}{\partial V}}{R(V)}$$

Figure 5:
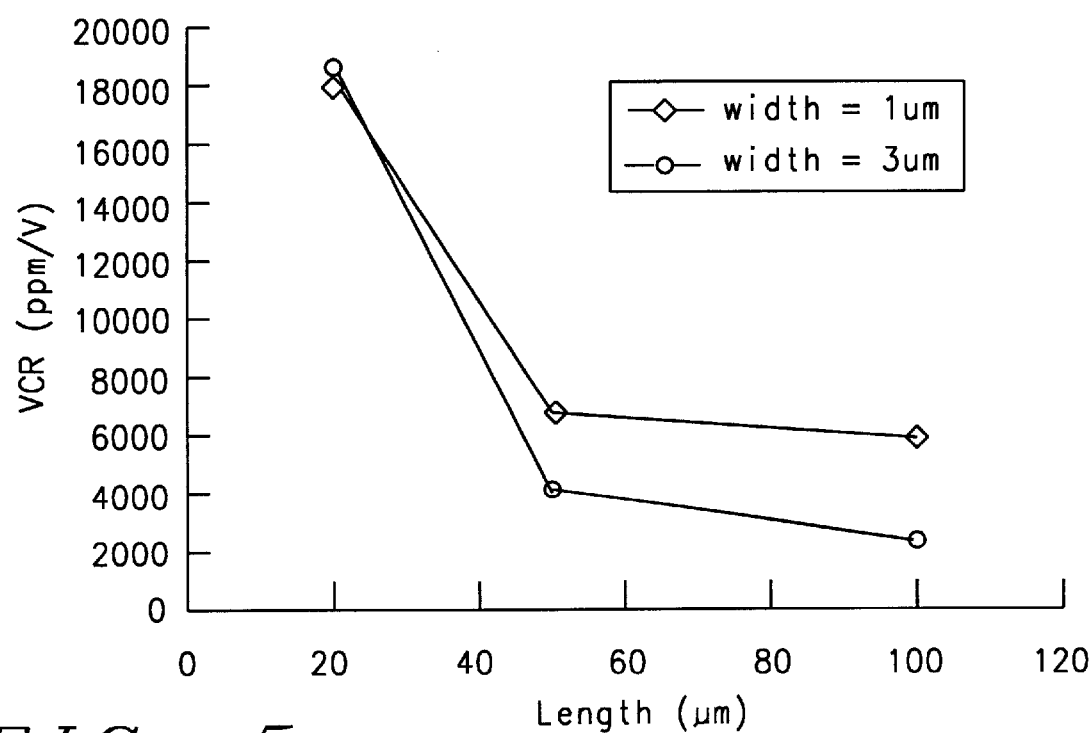
FIG. 5 is a plot of voltage coefficient of resistance (VCR) versus length for 1 μm wide and 3 μm wide high polysilicon resistors.

FIG. 5 is a plot of voltage coefficient of resistance (VCR) versus length for 1 μm wide and 3 μm wide high polysilicon resistors showing the dimension effect of VCR. As shown in FIG. 5, generally the wider and longer the resistor, the lower the VCR.

Figure 10:
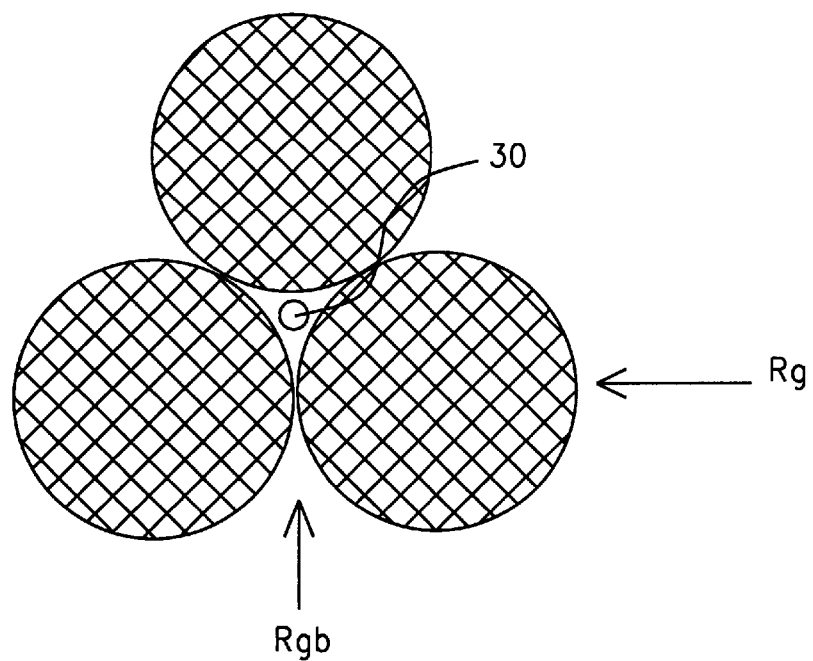
FIG. 10 is a schematic representation illustrating the difference between the current resistance of poly grain, $R_g$, and the current resistance of the grain boundary, $R_{gb}$, of polysilicon.

FIG. 10 illustrates the current resistance of the polysilicon grain, $R_g$, and the current resistance of the grain boundary, $R_{gb}$, of polysilicon. Note that $R_{gb} >> R_g$, that is when a current is forced across the polysilicon resistor, most of the DC stress current energy will be allocated to crossing the polygrain boundaries. After doping, with $P_{31}$ e.g., not all of the $P_{31}$ dopant fills into polysilicon grain boundaries. The polysilicon grain boundaries are re-crystallized by use of the DC stress current to make the $P_{31}$ impurity dopant re-fill the polysilicon grain boundaries. Thus the trapping density of the polysilicon resistor will be reduced, causing the polysilicon resistor to be more stable. The polysilicon resistor melts, then recrystallizes after removal of the DC stress current with the $P_{31}$ impurity dopant re-filling the polygrain boundaries, e.g. at 30, making the polysilicon resistor to be saturated.

When a DC stress current is applied to the various high polysilicon resistors to melt the polysilicon, the DC stress current is chosen such that:

the polysilicon breakdown current>the DC stress current>the grain boundaries recrystallization current Application of the DC stress current introduces sufficient energy for the polysilicon to melt but not enough energy to cause breakdown of the polysilicon. After the application of the DC stress current, the polysilicon grain boundaries recrystallize and introduce the dopant impurity to re-fill in the grain boundaries. The sheet resistance, $R_s$, is reduced and remains stable due to the decreasing trapping density of the polysilicon grain boundaries and saturation of the resistor.

Figure 9:
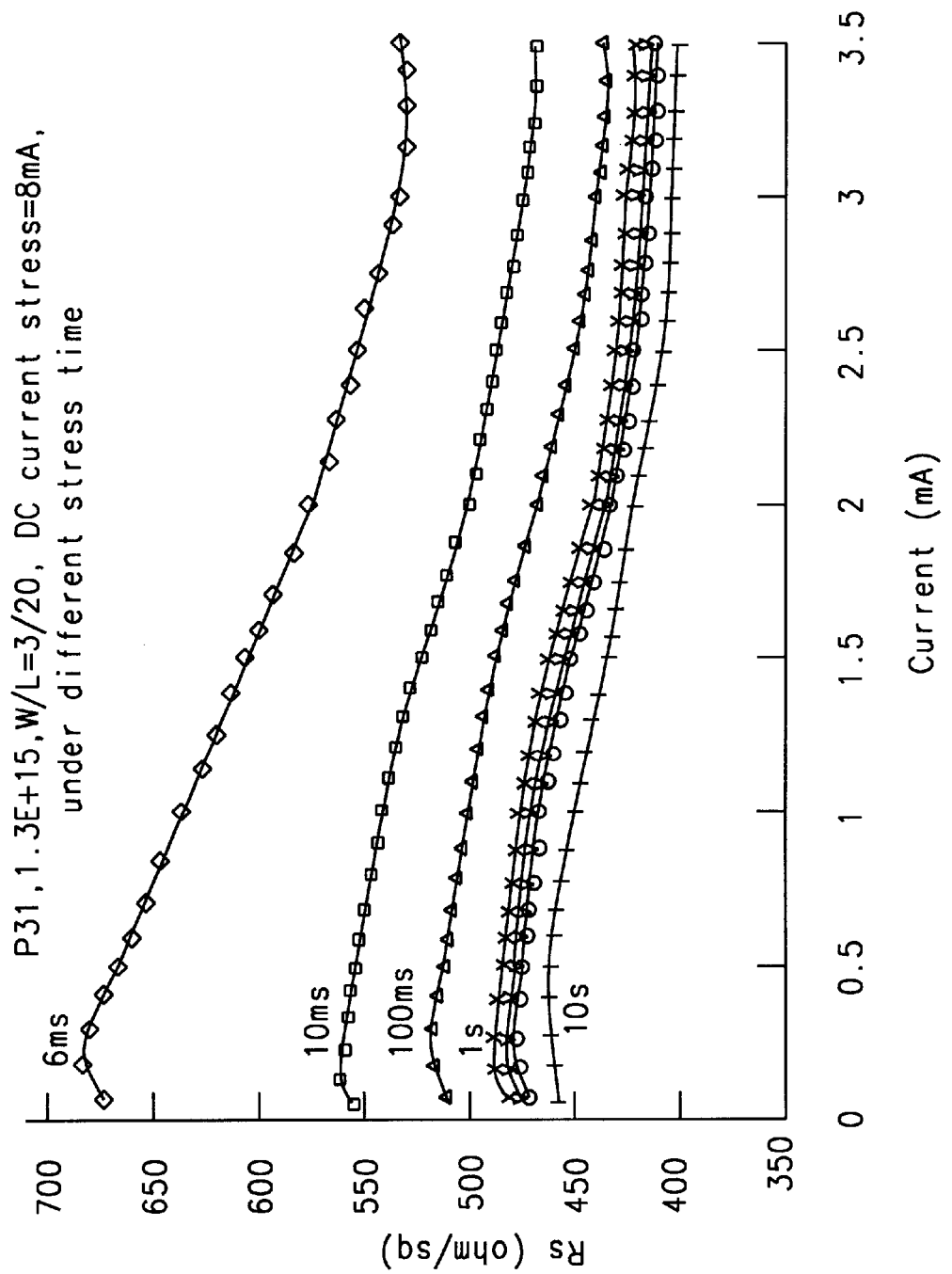
FIG. 9 is a plot of sheet resistance, $R_s$ versus current for high polysilicon resistors having been stressed with 8 mA of DC current for various stress times ranging from 0 ms (no stress) through 10 seconds.

FIG. 9 is a plot of sheet resistance, $R_s$, versus current for high polysilicon resistors stressed with 8 mA of DC current for various stress times from 0 ms (no stress) through 10 seconds. As shown in FIG. 9, these tests determined that a DC current stress time of one (1) second is sufficient to stabilize the Rs of high polysilicon resistors.

The DC current stressing step of the present invention is preferably implemented in the wafer acceptance test (WAT) stage but could also be introduced during wafer sort, or electrical testing of each chip on the wafer to determine electrical performance and circuit functioning, to improve the yield performance.

Figure 6:
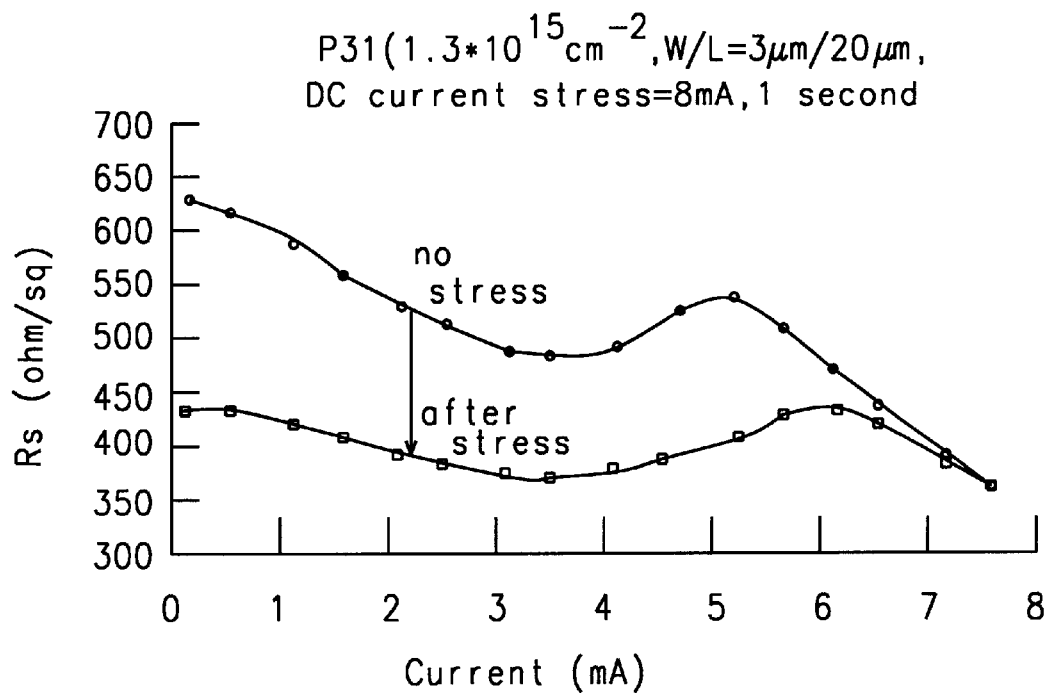
FIG. 6 is a plot of sheet resistance, $R_s$, versus current for a high polysilicon resistor before DC current stressing and a high polysilicon resistor after DC current stressing in accordance with the present invention.

FIG. 6 is a plot of sheet resistance, $R_s$, versus current for a high polysilicon resistor without DC current stressing and the same high polysilicon resistor after DC current stressing in accordance with the present invention. A 3 μm wide by 20 μm long high polysilicon resistor, therefore having 6.66□'s, doped with P31 @ $1.3*10^{15}$ cm$^2$ was used in the test. As shown in FIG. 6, after DC current stressing the resistor with 8 mA of DC current stressing for 1 second in accordance with the present invention, the sheet resistance was both markedly reduced and stabilized over a range of currents.

Figure 7:
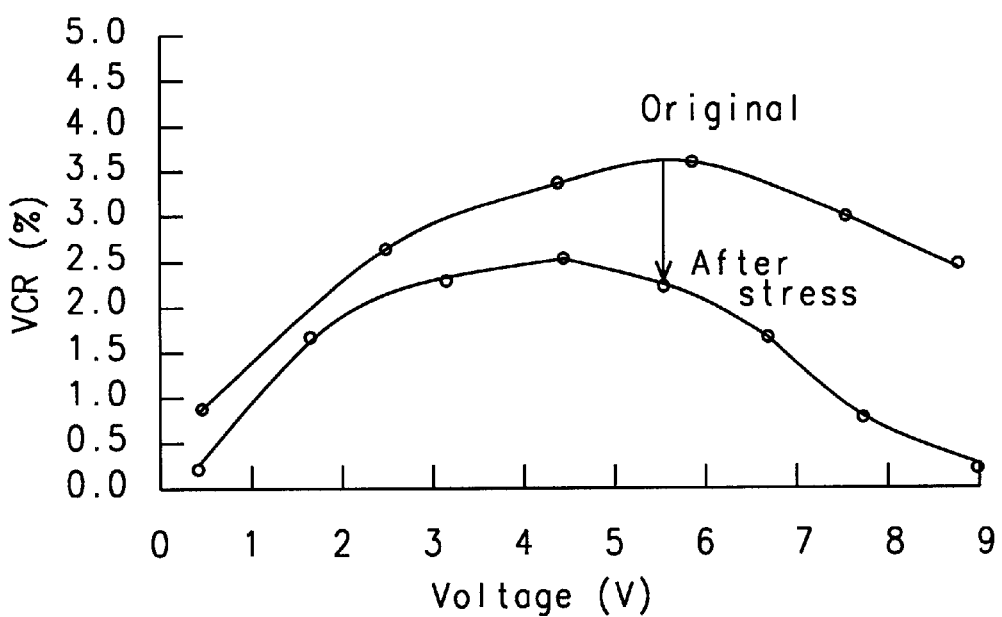
FIG. 7 is a plot of voltage coefficient of resistance (VCR) versus voltage for a high polysilicon resistor without DC current stressing and a high polysilicon resistor after DC current stressing in accordance with the present invention.

Additionally, as shown in FIG. 7, which is a plot of the voltage coefficient of resistance (VCR) versus voltage for a high polysilicon resistor without DC current stressing and the same high polysilicon resistor after DC current stressing in accordance with the present invention, the VCR typically can be improved from 5 to 60%. FIG. 7 demonstrates an average 37% VCR improvement, i.e. a 37% reduction.

Figure 8:
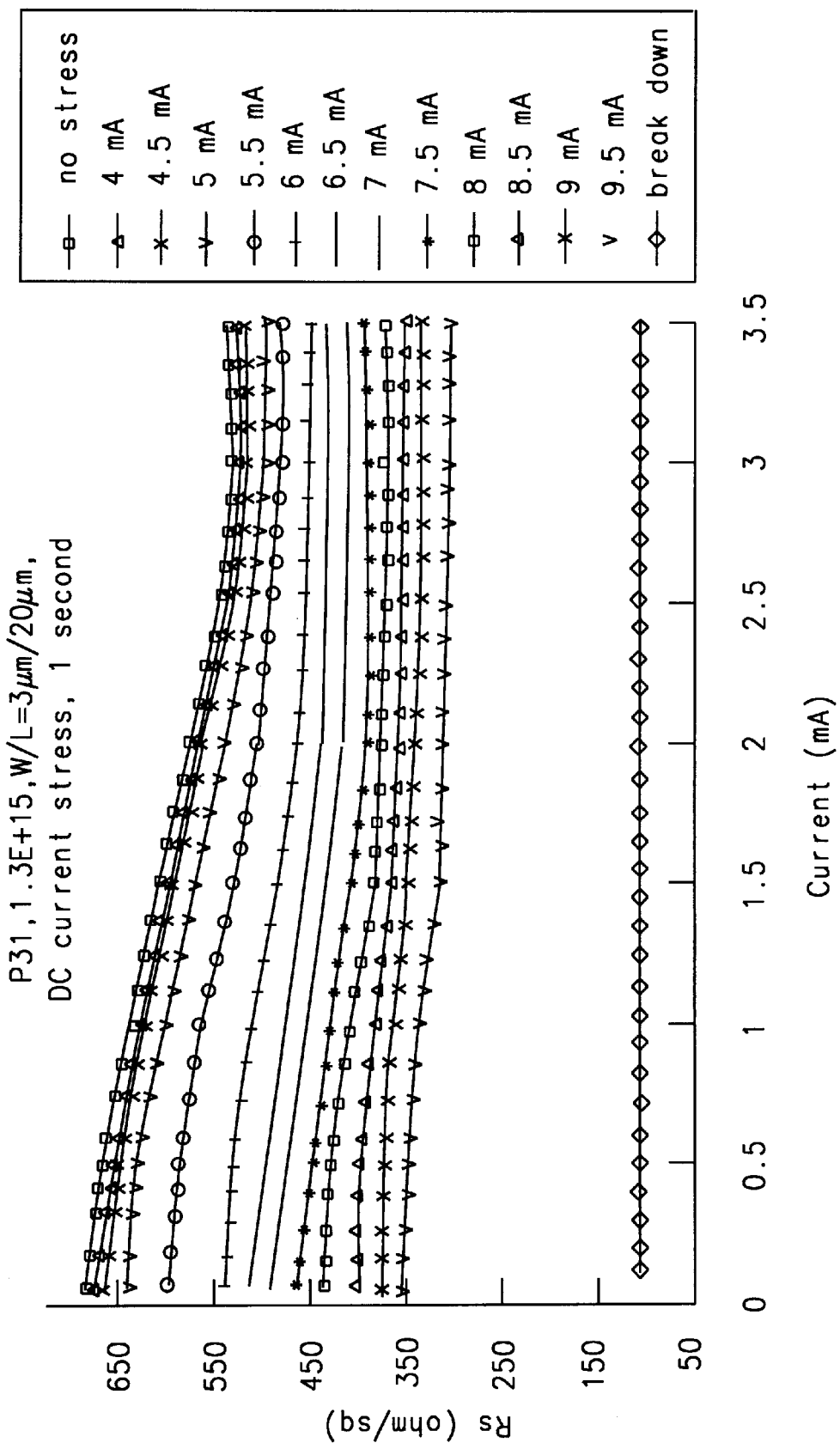
FIG. 8 is a plot of sheet resistance, $R_s$, versus current for high polysilicon resistors having been stressed by a one second DC current ranging from 0 mA (no stress) through 9.5 mA, and a 10 mA DC current sufficient to cause breakdown of the polysilicon.

FIG. 8, which is a plot of sheet resistance, $R_s$, versus current for high polysilicon 6.66□ resistors having a one second DC current stressing from 0 mA (no stress) through 9.5 mA, to a 10 mA DC current stressing sufficient to cause breakdown of the high polysilicon resistor. FIG. 8 illustrates that the preferred range of DC stress current is between about 7 mA through 9 mA. The more preferred DC stress current is about 8 mA per 6.66 's.

The preferred DC stress current is from about 7 mA to 9 mA and more preferred about 8 mA per 6.66□'s of resistor for a duration of from about 0.9 to 1.1 seconds and more preferred about 1.0 seconds. The preferred range of□'s is from about 2 to 500□'s and more preferred 6.66□'s. The greater the number of □'s, the greater the DC stressing current.

While particular embodiments of the present invention have been illustrated and described, it is not intended to limit the invention, except as defined by the following claims.

We claim:

1. A method of forming a high polysilicon resistor over a dielectric layer, comprising the steps of:
providing a polysilicon resistor over a semiconductor structure; said polysilicon resistor having a doped polysilicon layer having a first voltage coefficient of resistance and grain boundaries having a first trapping density;
providing a first level of DC current for a first duration through said doped polysilicon layer to stress said doped polysilicon layer to partially melt said doped polysilicon layer without causing breakdown of said doped polysilicon layer; and
removing said first level of DC current to recrystallize said melted doped polysilicon layer, whereby said recrystallized doped polysilicon layer has a second voltage coefficient of resistance less than said first voltage coefficient of resistance and grain boundaries having a second trapping density that is less than said first trapping density.

2. The method of claim 1, wherein said DC current stress step is performed during a wafer acceptance test stage.

3. The method of claim 1, wherein said DC current stress step is performed during a wafer sort stage.

4. The method of claim 1, wherein said first DC current is from about 7 mA to 9 mA per 6.66 □'s of said doped polysilicon layer and said first duration is from about 0.1 to 10.0 seconds.

5. The method of claim 1, wherein said first DC current is from about 7 mA to 9 mA for between about 2 to 500 □'s of said doped polysilicon layer and said first duration is from about 0.1 to 10.0 seconds.

6. A method of forming a high polysilicon resistor over a dielectric layer, comprising the steps of:
providing a semiconductor structure having an overlying field oxide layer thereon;
forming a polysilicon layer over a portion of said field oxide layer;
ion implanting a dopant to a first concentration within said polysilicon layer to form having a voltage coefficient of resistance thereby defining a high polysilicon resistor;
forming an interlevel dielectric layer over said doped polysilicon layer;
forming defined contact openings in said interlevel dielectric layer over said doped polysilicon layer;
forming metal contacts in said contact openings contacting said doped polysilicon layer; and
providing a first level of DC current for a first duration through said doped polysilicon layer to stress said doped polysilicon layer.

7. The method of claim 6, wherein said DC current stressing reduces the voltage coefficient of resistance of said doped polysilicon layer.

8. The method of claim 6, wherein said DC current stress step is performed during a wafer sort stage.

9. The method of claim 6, wherein said first DC current is from about 7 mA to 9 mA per 6.66 □'s of said doped polysilicon layer and said first duration is from about 0.1 to 10.0 seconds.

10. The method of claim 6, wherein said first DC current is from about 7 mA to 9 mA for between about 2 to 500 □'s of said doped polysilicon layer and said first duration is from about 0.1 to 10.0 seconds.

11. A method of reducing the voltage coefficient of resistance of a resistor by providing a first level of DC current for a first duration through said resistor to stress said resistor.

12. The method of claim 11, wherein said DC current stressing is performed during the wafer acceptance test stage.

13. The method of claim 11, wherein said DC current stressing is performed during a wafer sort stage.

14. The method of claim 11, wherein said first DC current is from about 7 mA to 9 mA per 6.66 □'s of said resistor and said first duration is from about 0.1 to 10.0 seconds.

15. The method of claim 11, wherein said first DC current is from about 7 mA to 9 mA for between about 2 to 500 □'s of said doped polysilicon layer and said first duration is from about 0.1 to 10.0 seconds.

* * * * *